United States Patent [19]

Schade, Jr.

[11] 4,211,941
[45] Jul. 8, 1980

[54] INTEGRATED CIRCUITRY INCLUDING LOW-LEAKAGE CAPACITANCE

[75] Inventor: Otto H. Schade, Jr., North Caldwell, N.J.

[73] Assignee: RCA Corporation, New York, N.Y.

[21] Appl. No.: 930,791

[22] Filed: Aug. 3, 1978

[51] Int. Cl.² ................. H01L 27/04; H01L 29/94
[52] U.S. Cl. .................................. 307/303; 357/14; 357/23; 357/48; 357/51
[58] Field of Search ............. 357/14, 23, 48, 51; 307/303, 296 R

[56] References Cited

U.S. PATENT DOCUMENTS

| | | | |
|---|---|---|---|
| 3,654,498 | 4/1972 | Chapron | 357/14 |
| 3,879,640 | 4/1975 | Schade, Jr. | 357/48 |
| 4,034,395 | 7/1977 | Abdelrahman | 357/51 |
| 4,039,857 | 8/1977 | Ahmed | 357/51 |
| 4,161,742 | 7/1979 | Kane | 357/51 |
| 4,164,668 | 8/1979 | Delaporte et al. | 357/51 |

OTHER PUBLICATIONS

Calhoun et al., IBM Tech. Discl. Bulletin, vol. 14, No. 11, Apr. 1972.

"Op-Amp IC's", EEE, Nov. 1969, pp. 16, 19-24.
Keonjian, Microelectronics, (McGraw-Hill, N.Y., 1963), pp. 317-319.

*Primary Examiner*—William D. Larkins
*Attorney, Agent, or Firm*—Paul J. Rasmussen; Allen LeRoy Limberg; Eric P. Herrmann

[57] ABSTRACT

An integrated-circuit MOS capacitor has a first doped semiconductive region forming one of its plates. This first semiconductor region is electrically isolated from the semiconductor substrate by a second doped semiconductor region, which is of opposite conductivity type to and intervenes between the substrate and the first semiconductive region. The present invention resides in the combination of such an MOS capacitor and a circuit for maintaining the potential in the second semiconductor region of the MOS capacitor structure substantially the same as that appearing on the first semiconductor region for minimizing leakage current flow between them. This circuit also provides the leakage current flowing between the second semiconductor region and the substrate, so the leakage current need not flow from the first semiconductor region.

3 Claims, 4 Drawing Figures

INTEGRATED CIRCUITRY INCLUDING LOW-LEAKAGE CAPACITANCE

This invention relates to integrated circuits of the type having a metal-oxide-semiconductor (MOS) capacitor wherein one capacitor plate is a semiconductor region and, more particularly to circuitry for reducing the flow of leakage current from that region into the semiconductor substrate material.

MOS capacitors typically comprise a semiconductor substrate of first doping type (p or n), a region of a second doping type (n or p) opposite to the first disposed within the substrate so as to leave an exposed surface and forming a first capacitor plate, a layer of dielectric material or a sandwich of dielectric materials overlying at least a portion of that exposed surface, and a further polycrystalline-silicon or metal electrode disposed on the opposite side of the layer or sandwich of layers from the exposed surface and forming the second plate of the capacitor. The semiconductor region acting as a plate of the capacitor forms a pn junction with the substrate, which junction is reverse-biased to provide electrical isolation. Leakage currents between the plates of an MOS capacitor are essentially zero. The leakage current of a reverse bias pn junction may be of the order of 1.5 microampere/cm$^2$ or less dependent upon the type of junction formed, and generally is not very significant for small-area junctions.

However, where large value integrated capacitors are required, for example, the compensation capacitor of an operational amplifier, the pn junction area is large, and there is a corresponding increase in total leakage current. Total leakage current is further increased by any elevation in temperature of the circuit, the current doubling for every 10° C. increase in temperature. MOS capacitors required to have capacitance values of twenty to thirty picofarads can have diffusion-to-substance leakage currents of 100 nanoamperes or more at elevated temperatures.

Micropower operational amplifiers operate with microampere total bias currents. Individual internal stages of such an amplifier operate on considerably less current. Such an amplifier stage, subjected to 100 nanoamperes of leakage, a substantial percentage of its quiescent operating current, may be rendered totally unresponsive to input signal variations. Circuits operating with considerably higher bias levels subjected to 100 nanoampere leakage can undergo severe shifts in input or output parameters, substantially affecting the operating points of the transistors in the circuit especially where a plurality of stages are in direct coupled cascade.

The present invention is embodied in a circuit arranging an MOS capacitor to have essentially no leakage current between its semiconductor plate and the substrate. The MOS capacitor has a first semiconductor capacitor plate of a first conductivity type which—rather than being disposed in the substrate—is disposed within an auxiliary semiconductor region of a second conductivity type complementary to the first conductivity type, which auxiliary region is disposed in a semiconductor substrate of the first conductivity type. The second capacitor plate is an electrode disposed parallel to and separated from the first capacitor plate by a layer or layers of dielectric material. Means are provided for maintaining the potential between said first and auxiliary regions at essentially zero volts, thereby eliminating the electric field essential to support current leakage between them.

Figure 1:
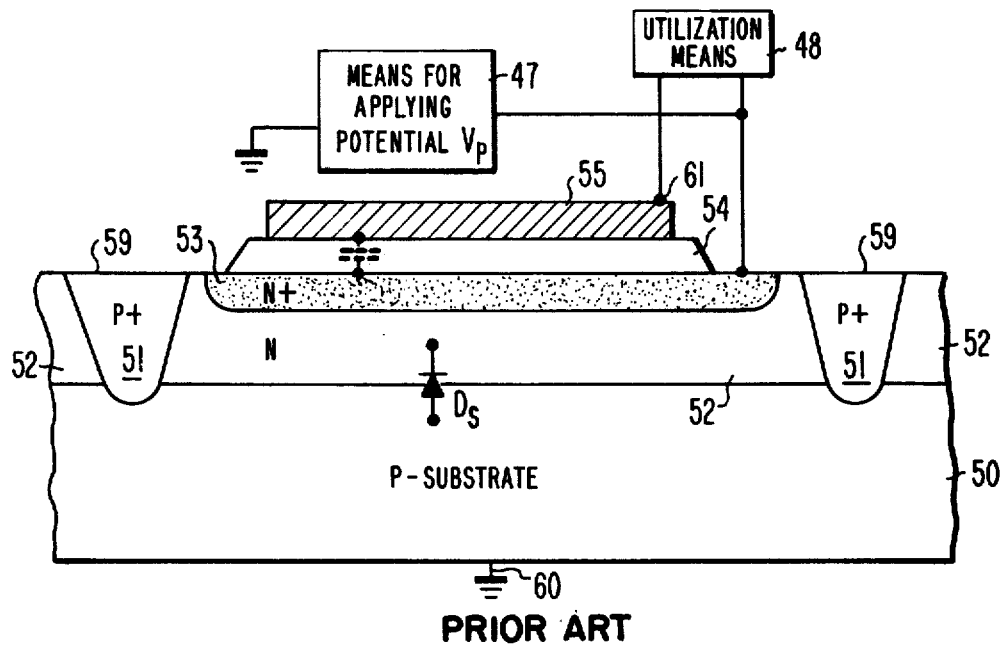
FIG. 1 is a cross-section of a typical prior art MOS capacitor structure.

Referring to FIG. 1, a cross section of a typical MOS capacitor constructed on a bipolar integrated-circuit substrate is illustrated. A silicon bipolar integrated circuit typically has a p-type substrate 50 on which an n-type silicon epitaxial layer 52 is grown. Heavily doped p-type regions 51 are diffused through the epitaxial layer into the substrate to divide the epitaxial layer into separate isolated areas in which integrated circuit devices are fabricated and electrically isolated. The interface between the epitaxial regions 52 and the substrate 50 forms a pn junction which is normally conditioned to be reverse biased. Diode symbol D$_s$ is superimposed on this interface in FIG. 1 to symbolize the junction and to indicate the anode of this junction is in the substrate and the cathode in the epitaxial layer. In forming the MOS capacitor per se a relatively low resistance n-type region 53 is formed in an isolated epitaxial region, which region is disposed at the semiconductor surface 59 and is of such area to function as a first capacitor plate of a parallel plate capacitor. An insulating layer 54 of silicon-dioxide, silicon-nitride or some other dielectric material is formed over the silicon surface on which a second electrode 55 is formed. This second electrode may be of polycrystalline silicon or a metal such as aluminum and functions as a second plate of a parallel plate capacitor. The capacitance afforded by the MOS structure is determined by the area of that portion of the dielectric layer which is between the parallel plates 53 and 54 and by the permitivity of the dielectric in that layer.

Two electrodes 61 and 62 establish ohmic contact to the capacitor plates and have connected between them a utilization means 48 for using the capacitance of the circuit element. Between electrode 62 and the substrate connection 60 a potential, V$_p$, sufficient to reverse bias the junction between the "semiconductor" capacitor plate 52 and substrate 50 is applied by the means 47, this provides electrical isolation between the substrate and the capacitor. In practice this potential means 47 may be subsumed in the utilization means 48.

Associated with the pn junction symbolized by D$_s$ is a depletion capacitance between substrate 50 and epitaxial region 52 which may effect the choice of connection of electrodes 61 and 62 in a particular circuit. Also associated with the pn junction symbolized by D$_s$ is a reverse-biased pn junction leakage current I$_L$. The leakage current I$_L$ is essentially proportional to the capacitance value of the capacitor. This is because the value of capacitance is a function of the area of the dielectric layer between the capacitor plates, and current I$_L$ is the leakage current density times the relevant junction area which substantially corresponds to the area of the dielectric layer between the capacitor plates. It is also dependent upon the reverse bias potential between regions 52 and 50, and upon the relative temperature of the structure.

Figure 2:
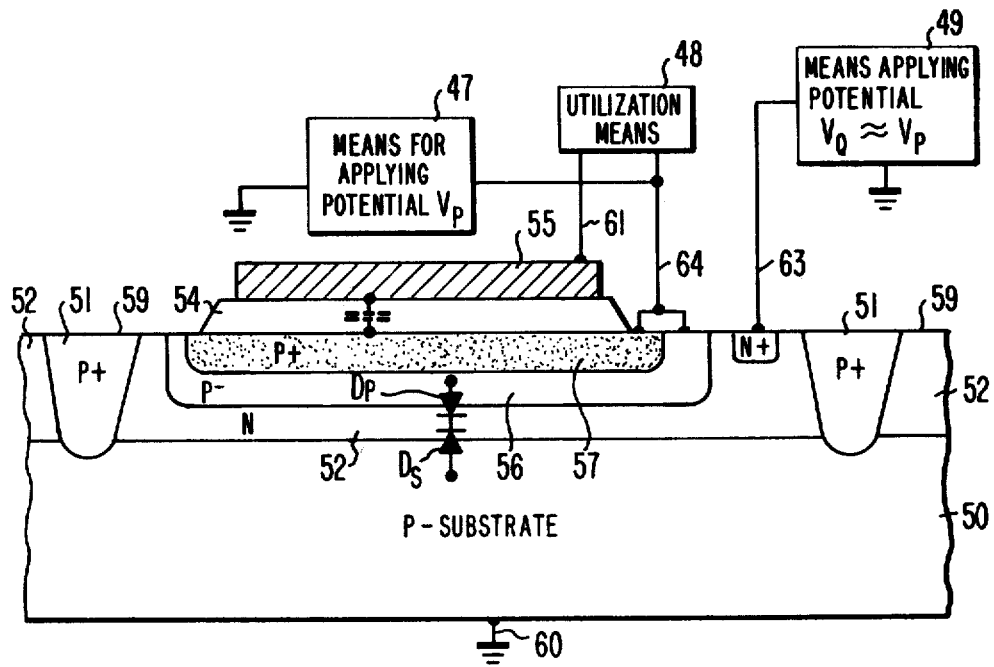
FIG. 2 is a block schematic diagram including a cross-section of an MOS capacitor structure constructed and operated in accordance with the invention.

FIG. 2 shows the MOS capacitor structure used in the invention. The MOS capacitor of FIG. 2 is fabricated in an isolated n-type epitaxial region 52 which region forms a pn junction $D_s$ at its interface with substrate 50. Electrical contact is established with epitaxy 52 via n-type degenerate semiconductor region 58 and electrode 63. The FIG. 2 MOS capacitor structure is distinguished from that of FIG. 1 by the first of the capacitor plates being provided by p-type region 56 disposed within the epitaxial region 52. Region 56 extends from the surface 59 into the bulk, but is constrained so as not to extend through the epitaxial region 52. Preferably the p-type region is structured to have a degenerate or low resistance sub-region 57 at its surface adjacent to the dielectric layer 54, with the remainder of the region adjacent to the interface with region 52 being of relatively low-doped or high resistivity material. The higher the resistivity of the silicon material 52, 56 at the interface of regions 52 and 56 the lower will be the depletion capacitance associated with the pn junction at this interface, which junction is symbolized by the diode $D_p$. The degenerate layer 57 at the surface functions as one plate of the parallel plate MOS capacitor and its low resistance serves to reduce the series resistance between the contacting electrode 64 and the portions of this plate more remote from the actual metallurgical contact. For low-frequency operation (e.g., in the audio frequency range) layer 57 is unnecessary and the region 56 extending to the surface 59 will function as the capacitor plate. Depending upon the actual density of dopant material determining the resistivity of region 56, a small region having a dopant concentration similar to region 57 may be required to effect ohmic contact between electrode 64 and the region 56. Regions 56 and 57 are maintained at the same potential by reason of their being the same conductivity type material which condition is indicated in the figure by the double contact of electrode 64. A dielectric or electrically insulating material 54 is formed on the semiconductor surface disposed over the semiconductor capacitor plate 57 upon which a second electrode 55 is formed of a metallic or refractory material as the second capacitor plate of the parallel plate MOS capacitor. This second capacitor plate is electrically connected to electrode 61.

At this point the diodes $D_s$ and $D_p$ used to symbolize pn junctions between adjacent regions will be assumed to be circuit schematic symbols indicative of the electrical properties of these pn junctions. Relative to the two p-type regions 50 and 56, n-type region 52 provides a common connection of the cathodes of effective diodes $D_s$ and $D_p$. A potential applied to region 52 via electrode 63 equal to the potential applied to p-type region 56 via electrode 64 establishes a zero-valued electric field across the pn junction between these regions. That is, there is zero potential across the effective diode $D_p$, so no current will flow between these regions. Due to the inherent built-in field of a pn junction essentially no current will flow in $D_p$ until the potential of 56 equals or exceeds the potential of epitaxial region 52 plus the diode offset potential of $D_p$, typically 0.6 volts for silicon.

Potential generating means 49 is provided to establish the potential on region 52, via electrode 63, at a potential $V_q$ similar to the potential $V_p$ present on regions 56 and 57 which is established via electrode 64. Potential generating means 49 is an auxiliary potential source which need only provide a d.c. potential to region 52 so long as "semiconductor" capacitor plate 57 (56) has signals applied to it which have small amplitudes relative to the offset potential of the pn junction formed between regions 52 and 56. Then effective diode $D_p$ will not be forward biased, and the potential of regions 56 and 57 will be determined by means 47. Potential generating means 49 may be any conventional direct potential source which can provide an output potential similar to that appearing at electrode 64. Preferably the output potential of 49 will track any changes in potential at 64 which are due to thermal changes in the circuitry of means 47 and 48 or the ambient in which they are located.

To utilize the capacitor in a circuit in which the signal on the "semiconductor" plate is sufficiently large to forward bias effective diode $D_p$, for example when $V_{peak}$ is greater than 0.6 volts, it is necessary that the potential means 49 generate a dynamic potential $V_q$ which is substantially the same in phase and amplitude as the signal $V_p$ applied to electrode 64. The means 49 may generate output potentials having both ac and dc potential components. The latter implementation of the potential means 49 may be a circuit parallel and similar to that circuit preceeding the capacitor. By way of example, if a first source-follower amplifier stage has its output coupled to drive electrode 64, and auxiliary and similar source-follower amplifier may have its input parallel with the input of said first source-follower for receiving an identical signal and have its output connection coupled to electrode 63 for energizing region 52 in similar fashion to the mode by which the first source-follower energized "semiconductor" capacitor plates 56 and 57. This implementation maintains essentially zero volts across effective diode $D_p$ substantially eliminating electric fields capable of supporting leakage current that might otherwise be established across the diode.

Figure 3:
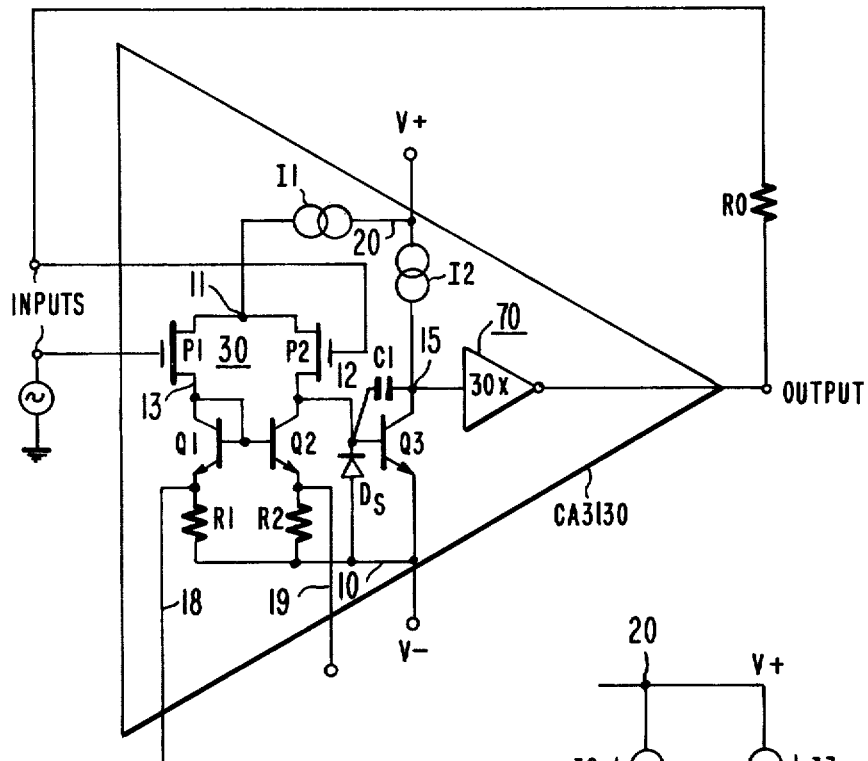
FIG. 3 is a schematic of a prior art operational amplifier employing an MOS capacitor.

FIG. 3 shows a portion of a prior art operational amplifier in which an MOS capacitor of the type illustrated in FIG. 1 is used. In the first stage, PMOS transistors P1 and P2 having their source electrodes interconnected to current source $I_1$ at 11 comprise a long tailed pair. NPN transistors Q1 and Q2 with degeneration resistors R1 and R2 comprise a current mirror load for the long tailed pair, converting the balanced drain current variations of P1 and P2 to a single ended output current available at interconnection 12. The aforementioned elements form differential amplifier stage 30 which drives an ensuing common-emitter, or CE, amplifier formed by NPN transistor Q3 and current source $I_2$. The CE amplifier has integrated MOS capacitor C1 connected between its signal input from interconnection 12 and its signal output terminal 15, which capacitor is employed for phase compensation. In such application the value of C1 is large, relative to typical integrated-circuit capacitances, ranging from 15 to 30 picofarads, for example. To realize this capacitance value requires a substantial amount of silicon area, approximately $5 \times 10^4$ square micrometers. The pn junction symbolized by $D_s$ has associated with it, then, a relatively large concurrent stray capacitance and a relatively large leakage current.

The capacitance of capacitor C1 is multiplied by the voltage gain of the CE amplifier—i.e., by the so-called "Miller effect" to establish the dominant pole of the amplifier and insure operational stability for all gain and bandwidth conditions. The frequency effects of the stray capacitance associated with $D_s$ are minimized by connecting the first or semiconductive plate of capacitor $C_1$ at the CE amplifier input where the signal amplitude is relatively small, and by connecting the second or metal capacitor plate, having no concomitant stray capacitance, at the CE amplifier output, where the signal amplitude is relatively large.

The leakage current across the junction symbolized by $D_s$ causes two detrimental effects. The first effect results from the leakage current being shunted away from the base of Q3 to shift the quiescent bias potential as temperature increases and thereby reduce available dynamic range. The second effect is manifested as an input offset potential between the input transistors of long tailed pair P1, P2 as a result of current imbalance in the current mirror load circuit due to the shunting of current through the leakage path. These problems with the use of an MOS capacitor in the FIG. 3 operational amplifier are illustrative of the range of problems in various integrated circuits which may arise due to leakage at one plate of an integrated MOS capacitor.

Figure 4:
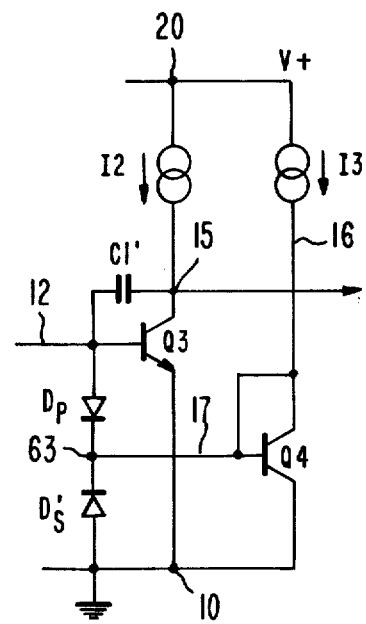
FIG. 4 is a schematic of a modification of the FIG. 3 operational amplifier made in accordance with the present invention.

FIG. 4 shows a modification made to the FIG. 3 operational amplifier in accordance with the present invention wherein capacitor C1 with the structure shown in FIG. 1 is replaced by capacitor C1' with the structure shown in FIG. 2. Capacitor C1' has its "metal" plate connected to the collector electrode of Q3, which also connects to the CE amplifier stage output terminal 15, and has its "semiconductor" plate connected to interconnection 12. The potential ($V_p$) at interconnection 12 is established by the offset potential across the forward biased base-emitter junction of Q3, the means 47 for applying this potential being the differential amplifier stage 30 as controlled by the overall direct coupled feedback loop in which the operational amplifier is connected.

Owing to the exponential collector current versus base-to-emitter potential characteristic of a bipolar transistor such as Q3, the base-to-emitter potential of Q3 will, during operation, experience only a few tens of millivolts of change from its quiescent value of about six or seven hundred millivolts. This potential which appears on the "semiconductor" plate of the MOS capacitor connected to the base of Q3 may be considered practically to be essentially non-varying in nature.

One may then apply a substantially similar potential to the semiconductor region 52 in which the "semiconductor" plate of the MOS capacitor (regions 56 and 57 in the structure of FIG. 2) is disposed, to reduce the leakage current flow over the pn junction symbolized by $D_p$, which similar potential need not reflect the variations with signal of the emitter to base potential of Q3. Such a potential is available at the base of grounded-emitter npn transistor Q4 conditioned by a direct-coupled collector-to-base feedback connection to conduct current applied to its collector electrode by a current source I3.

With the above connections the effective "semiconductor" plate to substrate potential of the MOS capacitor has been reduced from the six to seven hundreds of millivolts of quiescent potential to the few tens of millivolts of varying potential. The reduction in potential across the pn junction $D_p$ is accompanied by a more than linear reduction in leakage current from the "semiconductor" capacitor plate.

It is instructive to note that essentially the same reverse bias potential appears across the diodes symbolized by $D_s$ and $D_s'$ in FIG. 3 and FIG. 4, respectively. Both diodes therefore can be expected to have similar leakage currents which in the case of $D_s$ is supplied from interconnection 12 in FIG. 3 and in the case of $D_s'$ is supplied by current source $I_3$ in FIG. 4. In the former case the leakage current is shunted from a functional portion of the operational amplifier, affecting its performance. By contrast in the latter case the leakage current is supplied by an auxiliary circuit so the functional circuit is not affected by the leakage.

Further, the elements of FIG. 4, including the functional circuitry, and the added circuitry to minimize MOS comparator current leakage from the semiconductor plate, are fabricated on a common monolithic die in integrated circuit form, and are subject to like fabrication parameters and like thermal conditions due to their inherent close proximity. These conditions will generally cause transistors Q3 and Q4 to respond in similar fashion to thermal changes of the integrated circuit, exemplifying a means whereby the potential generating means 49 can track thermally caused potential variations of the utilization means.

The invention is shown in relation to an operational amplifier, but it is not to be implied that the invention is in any way restricted to this application. It will be understood that various omissions and substitutions and changes in the form and details of the device may be made by those skilled in the art without departing from the spirit of the invention, and the following claims should be construed accordingly.

What is claimed is:

1. An integrated circuit including a low-leakage capacitance comprising:

a semiconductor substrate of a first conductivity type material;

a first supply terminal for receiving a reference potential;

means providing ohmic contact between said semiconductor substrate and said first terminal;

an MOS parallel plate capacitor having as its first plate a first electrode, having as its second plate a first semiconductor region of said first conductivity type with an ohmically contacting second electrode, and having a dielectric layer between its first and second plates, and having a second semiconductor region of a second conductivity type complementary to said first conductivity type, which second semiconductor region having an ohmically contacting third electrode and forming first and second isolating pn junctions, respectively, with said first semiconductor region and said substrate;

means connected to the first and second electrodes of said MOS capacitor for utilizing the capacitance therebetween;

means for causing a determinable potential, different from said reference potential, at said second electrode;

means for applying to the third electrode of said MOS capacitor a similar valued potential to said determinable potential thereby to eliminate a potential across said first pn junction and forestall appreciable leakage current through said first junction which means includes, means exclusive of said first pn junction for supplying leakage current flow across said second pn junction.

2. An integrated circuit as set forth in claim 1 wherein said utilization means includes:

a first transistor disposed in said substrate having base and collector electrodes to which the second and first electrodes of said MOS capacitor are respectively connected and having an emitter electrode;

means for connecting the emitter electrode of said first transistor to said reference potential without substantial intervening impedance;

means for connecting the collector electrode of said first transistor to receive an operating current;

means for applying a varying current to the base electrode of said first transistor for causing said transistor to conductor between its collector and emitter electrodes and for causing the determinable potential at said second electrode to be substantially equal to the offset potential appearing between the base and emitter of said first transistor.

3. An integrated circuit as set forth in claim 2 wherein the means for applying to the third electrode of said MOS capacitor a similar-valued potential to said determinable potential and said means for supplying leakage current flow across said second pn junction together comprise;

a second transistor of the same conductivity type as said first transistor, disposed in said substrate and having base and collector and emitter electrodes, said second transistor being arranged to be operated at substantially the same temperature as said first transistor;

means connecting the emitter electrode of said second transistor to said reference potential without substantial intervening impedance;

means for applying a current of the same polarity as said operating current to the collector electrode of said second transistor;

direct coupled feedback connection from the collector to base electrodes of said second transistor for adjusting the base potential of said second transistor to condition it to conduct said applied current; and means for applying the base potential of said second transistor to the third electrode of said MOS capacitor.

* * * * *